(12) United States Patent
Fuchs et al.

(10) Patent No.: US 11,709,648 B2
(45) Date of Patent: Jul. 25, 2023

(54) DISTRIBUTED AUDIO PROCESSING SYSTEM FOR PROCESSING AUDIO SIGNALS FROM MULTIPLE SOURCES

(71) Applicant: TYXIT SA, Echichens (CH)

(72) Inventors: Gaétan Fuchs, Epalinges (CH); Raphaël Buache, Baulmes (CH)

(73) Assignee: TYXIT SA, Echichens (CH)

( * ) Notice: Subject to any disclaimer, the term of this patent is extended or adjusted under 35 U.S.C. 154(b) by 51 days.

(21) Appl. No.: 17/127,692

(22) Filed: Dec. 18, 2020

(65) Prior Publication Data

US 2021/0191686 A1 Jun. 24, 2021

Related U.S. Application Data

(60) Provisional application No. 62/950,623, filed on Dec. 19, 2019.

(51) Int. Cl.
| | |
|---|---|
| *G06F 3/16* | (2006.01) |
| *H04H 60/04* | (2008.01) |
| *H03F 3/181* | (2006.01) |
| *H04R 5/04* | (2006.01) |
| *H04H 60/90* | (2008.01) |
| *H04M 3/56* | (2006.01) |

(52) U.S. Cl.
CPC .............. *G06F 3/165* (2013.01); *H03F 3/181* (2013.01); *H04H 60/04* (2013.01); *H04H 60/90* (2013.01); *H04M 3/568* (2013.01); *H04R 5/04* (2013.01)

(58) Field of Classification Search
CPC ........ H04H 60/04; H04H 60/90; G06F 3/165; H03G 3/02; H03G 3/3005; H03F 3/181; H04M 3/568; H04R 5/04
See application file for complete search history.

(56) References Cited

U.S. PATENT DOCUMENTS

| 8,705,768 B2* | 4/2014 | Aiso ....................... H04H 60/04 381/104 |
| 9,318,086 B1* | 4/2016 | Miller .................... G10H 1/057 |
| 10,001,968 B1* | 6/2018 | Slick ....................... G10H 1/46 |

(Continued)

FOREIGN PATENT DOCUMENTS

WO WO-2014106690 A1 * 7/2014 ........... H04L 65/605

*Primary Examiner* — Carolyn R Edwards
*Assistant Examiner* — Kuassi A Ganmavo
(74) *Attorney, Agent, or Firm* — Maschoff Brennan

(57) ABSTRACT

A distributed audio processing system is disclosed, for providing users with the capability of producing a personalized audio mix of a plurality of signals from a plurality of audio sources. The system includes a wireless transmitter for each audio source and, for each user, a wireless receiver. The receiver comprises a programmable audio signal processor configured to process and mix a plurality of audio tracks received via a radio broadcast of a multi-track audio signal comprising the audio signals from the plurality of sources, said processing and mixing being programmable via received commands, instructions and/or parameters. The transmitters are configured to process the audio signals received from their respective sources, according to received commands, instructions and/or parameters. According to an embodiment, a user may provide commands, instructions and/or parameters to any of the receivers and/or transmitters of the system.

14 Claims, 1 Drawing Sheet

(56) References Cited

U.S. PATENT DOCUMENTS

| | | |
|---|---|---|
| 2007/0028750 A1* | 2/2007 | Darcie ................. G10H 1/0058 84/625 |
| 2010/0303260 A1* | 12/2010 | Stieler von Heydekampf ............ H04H 60/04 381/119 |
| 2012/0096371 A1* | 4/2012 | D'Anna ............... H04N 21/854 715/756 |
| 2014/0033900 A1* | 2/2014 | Chapman ............. G10H 1/0083 84/609 |
| 2014/0064519 A1 | 3/2014 | Silfvast |
| 2015/0228262 A1* | 8/2015 | Silfvast .................... G10H 1/18 381/119 |
| 2015/0254055 A1* | 9/2015 | Okabayashi ........... G05B 15/02 700/94 |
| 2016/0253985 A1* | 9/2016 | Skillings .............. G10H 1/0058 84/615 |
| 2016/0285573 A1* | 9/2016 | Terada ................... H04H 60/04 |
| 2017/0364341 A1* | 12/2017 | Mineda ..................... G06F 9/52 |
| 2018/0035232 A1* | 2/2018 | Dufosse ................ H04H 60/04 |
| 2020/0236456 A1* | 7/2020 | Gallo .................. H04R 1/1008 |

* cited by examiner

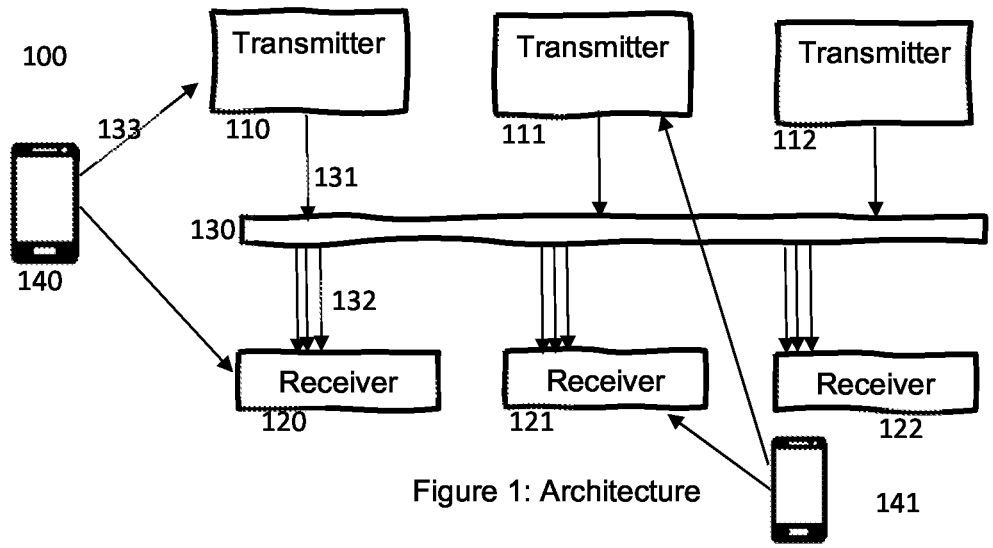
Figure 1: Architecture
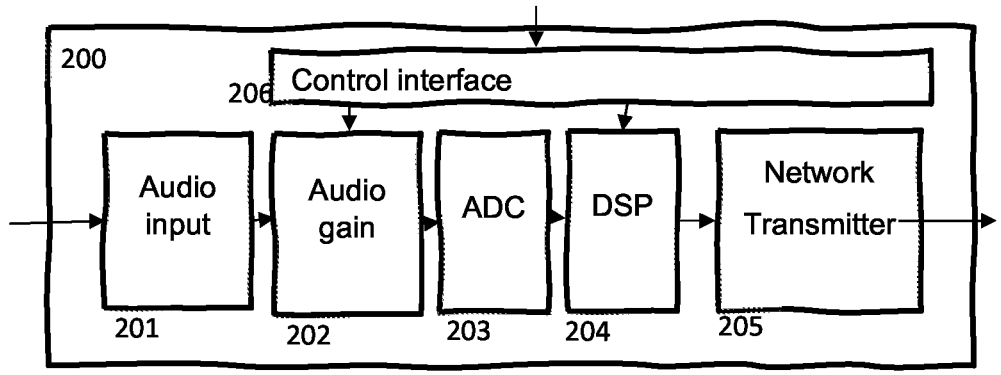
Figure 2: Transmitter
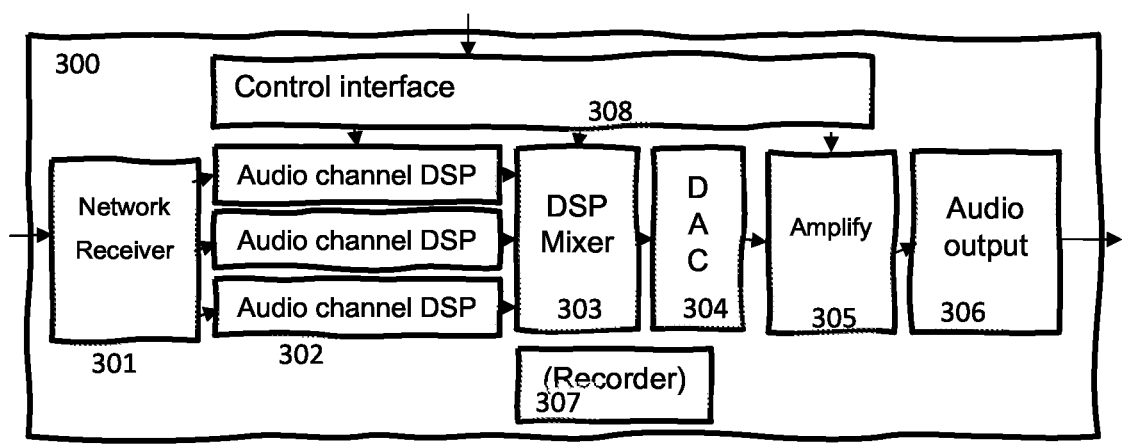
Figure 3: Receiver

DISTRIBUTED AUDIO PROCESSING SYSTEM FOR PROCESSING AUDIO SIGNALS FROM MULTIPLE SOURCES

TECHNICAL DOMAIN

The inventive concepts described herein relate generally to the domain of monitoring and processing of audio signals and find particular use in wireless in-ear monitoring systems for musicians in a group environment.

BACKGROUND

In a public performance situation, electronic audio signals representing the sounds being produced by a group of performing musicians are usually sent to a front-of-house mixing desk to be processed and then amplified and projected to the audience via loudspeakers. The musicians also need to be able to hear the sound that they are producing, and so monitors are usually provided for the musicians for this purpose. The monitors may be fixed monitors placed on stage facing the musician or they may be so-called in-ear monitors, which fit directly in or around the musician's ear and which generally have a wireless receiver. The sound being fed to the monitors may be mixed by a technician using the front-of-house mixing desk, or a dedicated monitor mixing desk, to route a mix of different sound channels back to the stage monitors or to the wireless receiver of the in-ear monitors. Whenever a musician wants to change the mix, for example by making his or her own instrument louder or softer or making another instrument louder or softer, the appropriate instructions need to be communicated to the technician, who then has to accurately implement those instructions. Furthermore, in situations where two or more musicians find themselves sharing a fixed monitor placed on the stage, the two or more musicians need to come to an agreement as to the instructions which will eventually be given to the technician regarding the mix to be sent to the monitor. Such agreement inevitably leads to a compromise where at least one musician finds themselves less than satisfied, even to the point of affecting that musician's comfort such that he or she finds it difficult to play.

In the case where each musician has an in-ear monitor, the communication between the musician and the technician can sometimes go wrong or can be otherwise difficult, as described above, thus leaving the musician in an uncomfortable situation and possibly leading to a sub-optimum performance of the music.

Moreover, the process of setting up a monitoring system, whereby each musician in turn provides his or her instructions to the sound technician until they are satisfied with the sound in the monitor, can result in very lengthy so-called sound checks before each musician eventually becomes satisfied with the result.

Another problem may occur due to the fact that settings which may be optimal for one piece of music or even one part of a piece of music may not be optimal for another part or another piece of the music. In such a case, it may not be possible for the musician to give appropriate instructions to the technician to make further adjustments while playing.

Wireless monitoring systems are known, where each musician has an in-ear monitor with a wireless receiver. The wireless receiver has an input for receiving multi-track audio from a central mixing desk or pre-mixing desk. The wireless receiver also has a control input for receiving control commands to alter the mix of the audio channels. The control commands may come from a portable controller such as a smart phone or a tablet computer. A drawback of this system is that certain characteristics of each of the audio tracks are already set at source and cannot be altered after reception. This means that those characteristics of the signals received and processed by the monitoring system are, in effect, pre-set. No further adjustment may be made to those characteristics after reception. Such characteristics include the gain of a signal at the source where the signal is produced. An inadequate, or otherwise inappropriate, gain of a signal at its source may lead to a deterioration of the quality of the signal. For example, the signal to noise ratio may be sub-optimal depending on the value of the gain.

It is clear from the situations described above that a problem exists in that it is not possible, or at least difficult, for each musician in a group to receive a personalized sound in his or her monitor, where the quality of the sound is optimal in that it is based on signals from their sources having optimal characteristics, such as signal to noise ratio for example.

United States Patent Application publication number US20100303260 A1 discloses a decentralized audio mixing and recording system comprising one or more decentralized mixers with audio inputs for one or more local audio input signals, a network adapter to connect to a network for receiving one or more mix busses from one or more other mixers on the network. The mixer further comprises a DSP for creating a local mix of the local audio input signal combined with the mix busses from the network. It is also possible to record the local mix or the raw signals from the mix busses and the local audio input(s). The connection to the network may be a wired connection, over which the local audio signal may be sent to the network and the separate mix busses may be received from corresponding further decentralized mixers in the system. The wired networks are generally packet-based networks. Examples of such wired networks include those which operate according to standards such as Ethernet, Fast Ethernet 100 BASE-T with Ethernet Audio Video Bridging (AVB) in accordance with an Institute of Electrical and Electronics Engineers (IEEE) standard such as IEEE 802.1, IEEE 802.1ak, IEEE 802.1 AB, IEEE 802.1AS, IEEE 802.1D, IEEE 802.1Q, IEEE 802.1Qat, IEEE 802.1Qav, Universal Serial Bus (USB), IEEE 1394. The document mentions that the network connection may otherwise be a wireless connection, operating in compliance with one or more wireless standards such as IEEE 802.11a, IEEE 802.11b, IEEE 802.11g or IEEE 802.11n, for example. As in the embodiments featuring a wired network connection, embodiments in which the communication with the network is via a wireless connection, the network is of a packet-switched type and the mix busses from each of the mixers in the network are therefore directly available as separate signals in the network. It is worth noting that in any of the above embodiments, some kind of addressing has to be included to indicate which packets belong to which destination or source. Some kind of coding is needed, for example somewhere in the network itself, in order to perform the necessary decoding to provide the correct signals for each mixer. The network may even be described as a decoding network. The decoder also needs to be aware of which mixers are present in the network in order to be able to provide the necessary decoding. Consequently, such a system cannot be said to be entirely "decentralized".

United States Patent Application publication number US20140064519 A1 discloses a distributed self-scaling network audio processing system. The system includes end nodes interconnected via a packet-switched wired or wireless network, each node operating as a peer on the packet-switched network on which each of the audio outputs of the nodes are made available. Each of the end nodes supports local input processing, mixing, and output processing. The input processing includes the option of dual input channels for supporting separate front-of-house and monitor workflows. End nodes are added to the system to support specific audio processing applications, based on the number of audio sources, the number of output mixes required, and the number of locations from which users choose to interact with the system. The system relies on Ethernet and IEEE Audio Video Bridge Standards, making exclusive use of packet-based network communication techniques.

BRIEF SUMMARY

Embodiments of an audio processing system disclosed herein provide musicians with the capability of easily adjusting their own monitor mix according to their personal preferences with regard to the relative volumes of the different instruments playing or the overall volume of the monitor output or any effects on either the overall output or on the sound of one or more of the instruments, such as equalizing adjustments and/or audio effects. Embodiments disclosed herein allow for such adjustments to be made wirelessly, although in other embodiments the adjustments may be made through hardwired interfaces on the devices where the adjustments are made. Moreover, according to embodiments disclosed, a musician or a sound technician may perform said adjustments by altering the gain of the electrical signal at various places in a signal chain between the instrument output and the output of the monitor, including a point just after the output of that instrument as the audio signal enters the audio processing system. By wirelessly, it is meant that the adjustments mentioned above may be made using wireless communications to control the adjustments on one or more devices where such adjustment is required. A controller may be used to allow a user to provide commands and/or parameters to a suitable processor in the corresponding device to perform the adjustments. In some embodiments, the control of the adjustments may be non-wireless, or at least partly non-wireless, in that a user may provide instructions to one or more processors of devices in the system by making a physical intervention on a physical control interface of a device of the system. In the embodiments described herein, the audio signal propagation from one part of the system to another is preferably wireless, for example via a radio broadcast transmission.

Such monitoring may find use in a live concert environment, a practice environment or in a studio recording environment where musicians may be isolated from each other acoustically. In order for each musician to be able to perform correctly, he or she needs to be able to adjust their own monitor mix to allow all instruments to be heard correctly.

According to an embodiment, a sound technician, a musician, several musicians in a session or all the musicians in the session may change the gain of the sound signals of any of the other musicians' instruments during the session. This embodiment may be interesting in the case where a musician plays different parts of a piece of music, each part requiring a different setting. For example, a part where a musician is providing a backing voice may require different settings form a part where the musician plays a solo. It may also be interesting if a musician plays different instruments requiring different settings during the same piece of music or during the same concert. In such a case, one of the musicians may play the role of the sound technician, in order to set the signals being provided by the instrument at an optimal level for the further processing of the signals to provide a result having the required quality.

A goal of some of the embodiments disclosed herein is to allow for a technician or a musician to remotely adjust the levels of signals provided by instruments as the signals enter the audio processing system, on an instrument by instrument basis, to ensure that each instrument provides a signal having an optimal level for further processing of the signals by the system to yield a result having an acceptable quality. Thus, separate, high quality monitoring mixes may be provided to each musician in a concert environment or in a recording environment and/or a high-quality front-of-house mix can be ensured for an audience during a live performance or a high quality recording mix can be provided in a recording environment.

It is worth noting that in a sound mixing system it is important to ensure that the signal to noise ratio of each signal input to the system is of a reasonable level so that further processing of the signals yields a high-quality result. A consequence of this is that processing of high-quality signals may be optimal in comparison with processing of signals which have to be corrected or otherwise enhanced, thereby leading to a reduction in the processing time required for high-quality signals. This has a direct effect on the latency between musician's audio signal entering the processing system and the processed sound reaching the musician's monitor, which in turn leads to greater comfort for the musician.

By allowing for a sound technician to intervene on signal characteristics anywhere in the chain from the where the sound signal leaves the instrument to where the processed sound is delivered to the monitors or to the front-of-house, this ensures an optimal sound quality to be achieved at the end of the chain, i.e. at the front-of-house or in the monitors, because the signal level can be adjusted at the appropriate place or places to ensure that each signal has the best signal to noise ratio. For example, in a configuration where each musician has a transmitter and a receiver having a mixer for providing his or her own mix and the sound technician has a receiver having a mixer for providing a mix for the front-of-house, a system according to an embodiment disclosed herein will allow the sound engineer to alter the gain, and therefore the level of a signal, at a transmitter as well as at a receiver, thereby allowing him or her to ensure the best sound quality for the audience or for a musician's monitor. In some embodiments the sound technician is also able to perform gain adjustments at any of the transmitters or otherwise be able to override any gain adjustments made at the transmitters by any of the musicians, thus giving the sound technician the final say over which adjustments are best for the front-of-house sound and for the musicians' monitors or for a live recording. In some embodiments the sound technician may also be able to adjust sound parameters at any of the receivers in the system. According to one embodiment, the adjustments may be made using wireless communication to provide control commands and parameters via a wireless link, whereas in another embodiment, commands may be entered manually on a control interface of one or more devices in the system described herein where such control is required.

Another goal of some of the embodiments disclosed herein is to provide a wireless monitoring system to allow a group of musicians in a live performance situation to receive the sound of each musician's own instrument as well as the remaining musicians' instruments, thus allowing each musician in the group to adjust his or her own mix in a decentralized manner.

Provision is made for a wireless system comprising a plurality of wireless transmitters each configured to transmit electronic signals from a corresponding audio source into a multi-track audio wireless broadcast signal. The system further comprises one or more wireless receivers configured to receive the wireless broadcast of the multi-track audio signals and to provide processing functionality to allow each audio track to be processed and mixed to provide a mixed audio output to a user. The receiver may comprise an audio output interface, otherwise known as an analog output interface or an analog audio output interface, for providing the mixed audio output to the user through an earpiece connected either wirelessly or hardwired to the audio output interface of the receiver. The system may further comprise one or more controllers for providing control instructions and/or control parameters to any of the transmitters and/or to one or more of the receivers, preferably, in order to be able to adjust certain characteristics of the audio signals at different places in the processing chain. The instructions and/or parameters may affect the audio signals in the analog domain or in the digital domain, or they may affect a digital processing function on a signal.

Systems according to embodiments described herein may find use in audio monitoring and/or mixing by musicians or by a technician in a live playing situation or during a recording session of a live performance. A musician or a technician using an embodiment of the system described herein may personalize a mix of the different audio signals received from the various transmitters in the system, thus enabling the technician or the musician to hear the personalized mix in a monitor, preferably an in-ear monitor, or to record the personalized mix or to provide the mix to an audience via a front-of-house sound reinforcement system. A user of the system may use one of the transmitters in the system to add a track to be heard by other users of the system. This may be useful, for example, if a technician wants to add a click track for all of the musicians during a recording session for example.

Embodiments of the system allow for a transmitter to be connected to an audio source and for the transmitter to synchronize with other transmitters in the system to allow for the sound from the audio source to become part of the radio broadcast signal available to all receivers in the system. Synchronisation is provided as part of the communications protocol used for the communication channel. An audio source may be a microphone output or an output of any other transducer for converting sound to an electrical signal or it may be an output from a musical instrument such as a guitar output socket or a piano output socket or sockets. Transmitters, according to an embodiment, are preferably adapted to be connected to any of the commonly known instrument connectors such as ¼-inch, ⅛-inch and XLR jacks for receiving the audio signals from their sources. Transmitters according to embodiments described herein may be incorporated or otherwise embedded within their corresponding instruments.

Embodiments of the system provide a musician or a sound technician with a receiver for receiving a multi-track audio broadcast radio signal from one or more of the transmitters described above. Such a receiver may be built into a headphone or an in-ear monitor for example or may be connected to a monitor placed on the floor of the stage or may even be worn by a musician or a technician and connected to a headphone or earpiece of the musician or technician. In at least one embodiment, the output of a receiver may be used to provide front-of-house sound for an audience. A receiver, according to an embodiment, may comprise a radio receiver for receiving the radio broadcast of the multi-track audio and a mixer for allowing a user to control parameters to be used to provide a personalized mix of the various tracks of audio signals, such mixing including gain controls, level controls, equalizing controls and effects controls, for example. Receivers may synchronize with the transmitters in order to be able to properly decode the multi-track audio signals from the radio broadcast signal. Synchronization is provided as part of the communications protocol used for the communication channel.

A controller, according to an embodiment, may be any programmable device adapted to communicate wirelessly with the receivers and transmitters of the system, for example via Bluetooth, for providing control instructions and parameters to process the audio signals in the receivers and/or the transmitters. The controller operates under the supervision of a software application.

According to a first aspect, there is described a system for providing each member of a group of musicians with a capability of receiving, mixing and hearing a combination of audio signals from every other member of the group and his or her own instrument, the system comprising, for each participating member, a wireless transmitter, a wireless receiver and a controller to provide mixing control instructions and/or parameters to one or more of the receivers and/or transmitters in the system. Provision is made for a distributed audio processing system for processing audio signals from a plurality of sources and for providing one or more personalized mixes of the audio signals to one or more users, the system comprising: for each source a corresponding transmitter; and for each user a corresponding receiver; each transmitter comprising:

an audio input interface configured to receive the audio signal from its corresponding source, the audio signal having a level;

a pre-amplifier configured to alter the level of the received audio signal by an amount determined by an input gain control parameter, thus applying a positive or negative gain to the received audio signal;

a digital signal processing unit configured to process the pre-amplified audio signal according to a transmission processing algorithm using one or more DSP control parameters;

a network transmission interface to provide the thus processed audio signal to the plurality of receivers as a multi-track audio signal via a communications network according to a predetermined communications protocol; and a control interface configured to receive at least the input gain control parameter and/or the DSP control parameters via a control link; and each receiver comprising:

a network reception interface configured to receive the multi-track audio signal from the communications network and to extract one or more audio tracks from the multi-track audio signal;

a plurality of audio channel digital signal processors each for providing digital processing functions on the extracted audio tracks according to a reception processing algorithm using one or more channel DSP control parameters;

a mixing digital signal processor to process a combination of the digitally processed audio tracks according to a mixing processing algorithm using one or more mixing control parameters;

an amplifier configured to alter a level of the combined digitally processed audio tracks by an amount determined by an output gain control parameter;

an output interface to provide the level-altered digitally processed audio tracks to the user; and a control interface configured to receive at least the channel DSP control parameters, the mixing control parameters and/or the output gain control parameter via the control link;

the system further comprising, for each user, a controller configured to provide the control parameters used at least by the corresponding user's receiver to said receiver via the control link;

wherein:

said controller is further configured to provide the control parameters used by any of the transmitters or by any of the remaining receivers to said transmitters or remaining receivers via the control link.

A system according to an embodiment comprises one or more radio transmitters for transmitting audio signals from one or more sources and one or more radio receivers for receiving the transmitted audio signals. Certain characteristics of the audio signals to be transmitted by a transmitter may be altered through digital and/or analog processing in the transmitter. These characteristics may be altered by providing a processor in the transmitter with appropriate parameter values to adjust the corresponding characteristics. Similarly, the receivers comprise digital and/or analog processing means to alter certain characteristics of the received audio signals and such characteristics may be altered by providing the processing means with the appropriate parameter values to adjust the corresponding characteristics.

The parameters may be provided to the transmitters and/or the receivers by means of a controller, via a control link. The control link may be a wireless control link, or it may be a wired control link. According to other embodiments, control may be provided manually through the use of a physical control interface on either or both of the transmitter and the receiver.

Receivers of the system preferably comprise a mixer for providing personalized mixing, by a user, of the different audio signals received in the radio signal, the resulting mixed signal being provided to the user via an audio output of the receiver to an earpiece in the user's ear.

According to an embodiment, a receiver may be used to provide a mix for an audience via a front-of-house sound reinforcement system. Such a receiver may be used by a sound engineer, whereas a receiver for providing a personalized mix may be used by a musician within a group.

According to an embodiment, a controller may control one receiver and one or more transmitters. Control parameters may be provided by the controller to alter certain characteristics of the audio signals in any of the one or more transmitters, including a level of the signal at the input of the transmitter. Other control parameters may be provided by the controller to alter certain characteristics of the audio signals at the receiver, such as the mix or the various different levels of each of the different audio signals received. A controller such as this may be used by a musician for providing user-level control.

According to another embodiment, a controller may be used to provide master-level, or master mode, control. Such a controller allows its user, usually a sound engineer or technician, to provide control parameters having an effect on characteristics of the audio signals in any of the receivers and in any of the transmitters in the system. This allows the sound engineer to take control of any of the characteristics of the audio signals while the musicians are performing, thus possibly effectively overriding any settings which were provided by the musicians. Controllers for use by the musicians of the group may be configured to provide user level, or user mode, control, whereby the user or musician is only allowed to control the mix provided by the mixer of his or her receiver and/or an output level or some other characteristic at the transmitter corresponding to that musician.

According to a second aspect, a method is disclosed for processing a plurality of audio signals from a plurality of sources and for providing one or more personalized mixes of the plurality of audio signals to one or more users, the method using the distributed audio processing system according to claim 1, the method comprising:

receiving and processing at least one of the audio signals in the wireless transmitter, said processing being controlled by at least one control parameter received by the wireless transmitter via a control link;

transmitting, by each of the transmitters, via a communications channel, the processed audio signal as a multi-track audio signal to the wireless receivers;

receiving and extracting, by at least one of the wireless receivers, a plurality of audio signals from the multi-track audio signal;

at least mixing, by the receiver, the plurality of audio signals to provide a combined audio output to the user, said mix being controlled by at least one mixing control parameter received via the control link.

Embodiments described herein provide for personal mixing of audio signals from multiple sources, allowing musicians playing in a group environment, either in a concert setting, a rehearsal situation or a recording configuration, to each be able to receive and personally mix the sound from their own instrument and the instruments of the rest of the musicians in the group in an in-ear monitor. Furthermore, these embodiments allow musicians to each be able to personally mix the sound of their own instrument and of the rest of the musicians in the group, whereby such mixing may involve altering the level of a signal provided at the output of an instrument. Such level alteration may be provided by a pre-amplifier, thereby providing gain to the signal from the instrument. These embodiments provide for remote mixing of audio signals from multiple sources, thus ensuring that the signals at the input of the mixing system are optimal. According to embodiments, when an adjustment is made to a characteristic of an audio signal, such as a level of the signal, at a transmitter, a corresponding compensating adjustment may be made at one or more of the receivers. Provision for such compensation may be provided automatically, where one or more of the receivers also receive the control command and/or corresponding parameter which causes the level of the signal at a transmitter to change. The receiver may then compensate for the adjustment made at the receiver in order to keep an adequate signal quality after the level change at the transmitter. A sound engineer may use the system for adjusting the sound for an audience, via a front-of-house sound reinforcement system. According to some embodiments, any of the musicians may play the role of a sound engineer.

BRIEF DESCRIPTION OF THE DRAWINGS

The inventive concepts described herein will be better understood thanks to the detailed description which follows and the accompanying drawings, which are given as non-limiting examples of embodiments of the inventive concepts, wherein:

FIG. 1 illustrates a system according to an embodiment disclosed herein;

FIG. 2 illustrates a transmitter which may be used in a system according to an embodiment disclosed herein; and FIG. 3 illustrates a receiver which may be used in a system according to an embodiment disclosed herein.

DETAILED DESCRIPTION

FIG. 1 shows a system 100 in which an embodiment disclosed herein may be deployed. A group of musicians produce audio signals using their instruments. The audio signals may be produced either directly, using an electronic instrument such as a keyboard, synthesizer or sequencer for example, or indirectly using an acoustic instrument such as a voice, a saxophone, a drum kit or a guitar, along with a transducer such as a microphone or a pick-up to convert the acoustic sound or mechanical vibrations of the instrument to an electronic audio signal. Each instrument may produce one or more audio signals, for example in the case of an electric piano there may be left and right audio signals forming part of a stereo signal, or a drum kit may have four or five microphones for each of the different elements of the kit, which means that the drum kit provides four or five audio signals.

According to an embodiment, for each audio signal to be involved in the system, a transmitter is provided, each transmitter being configured to receive the audio signal or signals from its corresponding instrument or instruments either using wired or wireless means. An audio signal may be a stereo signal, in which case the transmitter may be a stereo transmitter with left and right audio input channels. In the example in FIG. 1, each transmitter is a mono transmitter. For each participant in the system, for example a musician or a sound engineer may be a participant, a receiver is provided. Furthermore, for each participant, a controller may be provided.

More specifically, the system 100 according to the embodiment illustrated in FIG. 1 comprises three transmitters 110, 111, 112, a communication channel 130 and three receivers 120, 121, 122. This embodiment further comprises two controllers 140, 141, preferably remote-control devices or controllers 140, 141, which can either be dedicated control devices or which can be conventional multi-purpose control devices such as a smart phone, a tablet or a computer, for example, comprising a dedicated application. In this example, only two controllers are shown. However, embodiments of the system disclosed herein generally have at least as many controllers as there are receivers. Each participating musician would generally have a receiver and a corresponding controller at least to be able to alter his or her own mix of received audio signals 132. A sound engineer may also have a receiver and a controller.

According to an embodiment, a transmitter may be housed within a microphone or within a musical instrument or in a transducer within a musical instrument. According to another embodiment, a transmitter may be adapted to be attached to a standard microphone, transducer or instrument, thus allowing the standard microphone, transducer or instrument to be adapted to operate within a system according to an embodiment.

According to an embodiment, a receiver may be part of a wearable device, carried or worn by a musician. The receiver may have an audio output, to which an earpiece may be attached, to be worn by the musician. According to an embodiment, a receiver may be part of a front-of-house mixing console, operable by a sound engineer to provide front-of-house sound reinforcement to an audience.

FIG. 2 shows a transmitter 200 which may be used in an embodiment disclosed herein. A radio transmitter 200 for transmitting audio signals, as used in an embodiment, comprises at least one audio input interface 201 to receive a signal either directly from an instrument played by a musician or from a transducer such as a microphone. The audio signal or signals may be processed in the transmitter by a pre-processor 202, which may be adapted to adjust the level of the audio signal or signals, thereby providing positive or negative gain to the audio signal or signals, the pre-processor being controlled using control parameters received via a transmitter control interface 206, which receives commands and control parameters via a communications channel from a controller.

As will be described in greater detail below, the transmitter control interface 206 can adapt or modify the gain provided by the pre-processor. The control of the gain, or level, may be made either directly by the musician on his own transmitter, locally or remotely via a control link 133, or remotely via the control link by another musician or by a sound technician. According to some embodiments, the pre-processor may be an amplifier, or pre-amplifier, configured to change a level of a signal at its input, thereby providing positive or negative gain to the signal.

The analog signal output by the pre-processor 202 may then be transformed to the digital domain using an analog to digital converter 203. The thus produced digital signals may further be processed in the digital domain by a digital signal processing unit (DSPU) 204. The processing in the DSPU may comprise for example equalizing or audio compression, based on custom parameters provided by the controller, via the control interface 206 in the transmitter. Again, the parameters sent via the transmitter control interface can be set by the musician on his/her own transmitter, by another musician or by a sound technician. Generally speaking, processing which may be done in the transmitter may include equalization, compression, distortion, addition of effects and so on.

The DSPU 204 may also perform digital compression of the digital data in order to reduce the bandwidth required to transmit the signals. The digital data may also be otherwise processed, for example by using encryption algorithms or in order to introduce error correction techniques for example.

It is worth noting that the embodiment of the transmitter shown in FIG. 2 is adapted to receive an analog audio signal from the instrument and therefore includes an analog to digital converter to provide an appropriate input to the DSPU. Other embodiments exist in which the transmitter is adapted to receive a digital audio signal from the instrument, in which case no analog to digital converter is required. In such embodiments, the pre-amplifier may be a digital pre-amplifier.

The transmitter 200 may further comprise a network transmitter, or network transmission interface 205 to format the digitally processed audio signals for transmission over the communication channel or network.

The communications channel may be a wired network or a wireless network. The network may use a packet-based communications protocol, or it may be a broadcast network. Preferably, the network should provide for low latency between the transmission and reception of the audio signals. Preferably, the latency should not exceed 2 ms, but latencies of up to 10 ms may still provide for adequate operation.

The parameters of the transmitter control interface can also be adjusted automatically, in order to have an optimal output from the transmitter. This optimal output can be obtained by a feed-back loop in which an optimal output is defined for each instrument, each musician or each channel. The output of the transmitter may be compared with the optimal output with the control parameters for the transmitter being automatically adjusted in order fix the output level to be as close as possible to the optimal output.

FIG. 3 shows a receiver 300 which may be used in an embodiment disclosed herein. The receiver 300 may be a radio receiver for receiving audio signals from a radio transmission via a communication channel and it may comprise a network receiver, or a network reception interface, 301 configured to receive nearly all or all of the formatted audio signals present in the communication channel. The network reception interface may provide a different channel or track for each of the audio signals in the transmission.

A channel DSP 302 may provide digital processing capability, such as equalization, compression, distortion, addition of effects and so on, independently of each audio track or channel extracted from the broadcast, based on control parameters provided by the controller via the control interface 308. The channel DSP may also comprise a decompressor to provide digital data decompression thus allowing for a reduction in the network bandwidth requirement. FIG. 3 shows one audio channel DSP per audio track or channel received.

The signals coming out of the channel DSP unit may go into the main DSP 303, or mixing DSP, which can balance all the channels, mute or highlight some channels, balance a stereo signal and so on based on incoming control parameters from the controller via the control interface 308.

Finally, a DAC 304 may convert the digital audio signal to an analog audio signal. This signal may further be processed using an optional analog gain control 305, such as an amplifier to change the level of the thus-converted analog audio signal, thereby providing gain. An analog output stage 306 may then be used to provide the audio output signal for the user. The gain of the amplifier may be controllable using commands and/or parameters received from the controller via the control interface 308.

FIG. 3 shows an embodiment where the output provided to the musician is an analog output. According to another embodiment, the output provided to the musician may be a digital output, in which case the receiver does not need to comprise a DAC and the amplifier and audio output interface may both be adapted to operate in the digital domain.

The receiver may further comprise an optional recorder 307 to record all or some of the channels, either separately in raw format or from the output of the mix. The recording can be stored in a local memory or transferred via a digital interface to a storage device.

According to an embodiment, the transmitter may comprise a recorder (not shown), which may be used to store raw audio of the signal from the instrument or to record the audio signal after the DSPU in the receiver. The recorder may store the signal either in digital or analog format.

The audio transmitters (transmitters) and/or the audio receivers (receivers) may have a physical interface to allow the user to provide the control parameters. Control parameters may otherwise be provided by a controller, via a control interface of the transmitter and/or of the receiver across a control link.

The system may further comprise one or more controllers 140, 141 to provide control instructions and/or control parameters to the audio transmitters and audio receivers via the control link. The control link allows for instructions and/or control parameters to be passed to the transmitter via the transmitter control interface and to the receiver via the receiver control interface. In other embodiments, a manual control interface may be provided on the transmitter or on the receiver or on both the transmitter and the receiver, thus allowing for the control instructions and/or control parameters to be provided manually, either to the transmitter(s) to the receiver(s) or to both the transmitter(s) and the receivers(s).

The control link, or controller link, may be a wired or wireless link, using any suitable protocol. Useable protocols include point-to-point protocols or mesh protocols.

A controller may be a tablet, a smartphone, a netbook, notebook, computer, mobile device, or a physical mixing control panel.

A controller may control parameters such as analog gain, DSP parameters on the transmitter side and it may be able to control the DSP features on the receivers. However, in the situation of a band performing, controllers, as used by musicians, are preferably limited to controlling parameters of each musician's own instrument and/or microphone and the personal monitoring or mix on their personal audio receivers. Otherwise, controllers, as used by a sound engineer for example, may be configured to allow the sound engineer to control the parameters of any audio transmitters or audio receivers, regardless of which musician own the transmitters or receivers.

Embodiments disclosed herein allow for the audio transmitters to be controlled in such a way that the audio signal is prepared or otherwise conditioned before being transmitted. This is important because the audio signals, once transmitted, are made available to all of the receivers. By arranging for the audio analog gain to be adjusted on the audio transmitter side, the signal to noise ratio can be maximized before transmission, thereby provide for a greatly improved audio quality.

Changing the gain on the transmitter side may however have its problems and so proper care should be taken to ensure that a good signal is provided on the receiver side. Proper attention to this may be provided during on-stage setup for example. However, an optional feature is to lock the gain of transmitters during performances. As a precaution, the system may be set such that if the gain of a transmitter changes, then the channel DSP on the audio receiver will adapt consequently thereby avoiding the introduction of a level change at the outputs.

According to embodiments, a memory may be provided in the system, for example in one or more receivers or in one or more transmitters, for storing a configuration set-up. For example, members of a group in a rehearsal configuration using an embodiment as described herein may each adjust one or more control parameters or settings of their receivers and/or one or more control parameters or settings of one or more of the transmitters until satisfactory monitoring conditions are achieved. Such settings and/or control parameters may then be stored in a memory within the system to allow for the same monitoring conditions to be recalled.

According to an embodiment, provision is made to allow a group of musicians who have practiced at their own premises and arrived at a configuration setting for an embodiment of the system, which provides each musician with satisfactory monitoring conditions, to store all or part of such settings somewhere on the system so that during a future practice session the settings may be recalled and applied. For example, according to an embodiment, a memory may be provided in the receiver, in which settings which a user of the receiver has made can be stored for future recall. Settings stored in such a stings memory may include for example, a gain setting for one or more of the transmitters in the system, one or more commands and/or parameters affecting DSP functionality of one or more of the transmitters, for example a compression value or an equalization setting or the like, a gain setting for the user's receiver or a mix setting or effects setting for the digital processor of the user's receiver. Other settings may also be saved. Similarly, a controller or a transmitter may comprise a settings memory for storing and recalling particular settings.

In embodiments in which settings can be conveniently recalled from a memory, a group of musicians who have reached satisfactory monitoring in their practice environment for example, may appear at a performance environment, different from their practice environment, and recall and apply the settings which provided satisfactory monitoring in their practice environment. Thus, when the musicians are playing in the performance environment, they may enjoy the comfort of being able to reproduce the same monitoring conditions that they have been used to during rehearsals at the practice environment. A sound technician at the performance environment, provided with a receiver and a controller according to an embodiment described herein, may then use his or her controller to modify the settings recalled by the musicians, notably the settings which apply to the transmitters of the system, and to modify the settings at his or her receiver in order to provide a sound mix of suitable quality to a front-of-house sound re-enforcement system at the performance environment.

According to an embodiment, one or more of the receivers of the system is configured to monitor commands, instructions and/or control parameters which are communicated to the transmitters and consequently to take remedial action should a signal characteristic at a transmitter, for example a gain, be altered either by a musician or by a technician, the remedial action acting on the corresponding receiver being to compensate for the change in signal characteristic at the transmitter, thereby maintaining audio signal quality. In this manner, receivers may automatically compensate for changes made at transmitters which would otherwise affect the signal quality at the output of the receivers and ultimately in a musician's monitor or in the front-of-house sound reinforcement system where the receiver is used by a sound technician operating on the front-of-house sound reinforcement.

The controllers may connect via the control link directly to the transmitters and/or the receivers for providing control instructions and/or parameters, or they may be connected to only one transmitter or one receiver and the particular transmitter or receiver may then relay the information to the target device.

The network, or communication channel, may be wired or wireless and may use packet-based protocol or broadcast signals. However, the network should provide a low latency link between the transmission and the reception of the audio signals. It should not exceed 10 ms and ideally not exceed 2 ms.

An audio receiver as used in embodiments disclosed herein comprises at least one input connected to a network reception interface in charge of and able to receive all or a part of the digital signals sent by the transmitters on the network. The network reception interface comprises a plurality of outputs, corresponding to a plurality of channel digital signal processing units (DSPU), each configured to perform audio digital signal processing on one of the plurality of outputs. Each channel DSPU may correspond to a specific audio channel. Each channel DSPU can process a digital audio signal, the processing being for example equalization, compression, distortion or any other possible effect. The channel DSPU may also comprise a decompressor configured to perform digital decompression of the signals received from the network, thereby allowing for savings on network bandwidth.

The effects that are applied to the audio signals or the processing of these audio signals are controlled by a receiver control interface that is similar to the transmitter control interface. The parameters of the receiver control interface can be at least controlled by the musician using the specific receiver. This enables this musician to choose the sound he hears for each instrument for example.

According to a specific embodiment, the parameters of the receiver control interface can be also be controlled by another musician or a sound technician. This can be useful for example when it is not possible for the musician using the specific receiver to adjust the sound he hears, for example at the beginning of a solo. This enables a sound technician or another musician to act in place of the soloist, for example in a predefined way.

Once the digital audio signals have been processed by each channel DSPU, they are transmitted to a mixing digital signal processing unit, which is configured to combine and mix the signals from the channel DSPUs. The processing of the mixing DSPU may comprise balancing some or all of the individual channels, muting of one or more of the channels, changing the levels of one or more of the channels, changing the levels of the combined mix, stereo balancing, adding effects and so on. Such processing is controllable through the use of mixing control parameters received via the receiver control interface.

In FIG. 3, the output of the mixing DSP is converted to an analog signal using an analog to digital converter. In other embodiments, where the output is to be provided to the user as a digital signal, the analog to digital converter shown in FIG. 3 is not required. A volume processing unit, or amplifier, may be provided to adapt the level of the mixed output to be provided to the user. Control parameters received via the control interface may be used to control the operation of the volume processing unit.

The signal processed by the volume processing unit is then transmitted to an audio output interface to be provided to the user. The audio output may be provided to an in-ear headset or to over-ear headphones for example.

Optionally, a recorder can be hosted in the receiver to record signals representative of the sound in the receiver. The recorder can record analog or digital signals, depending on where the recording is made. It is also possible to record each channel independently from one another or to record several channels mixed together. As an example, the recorder can record groups of channels and store different mixes.

The recording can be stored in a local memory of the receiver or can be transferred directly to an external device via a digital interface such as USB or wireless communication means.

As already mentioned, the transmitters and the receivers each comprise a control interface. This control interface can have a physical interface enabling a musician or a user to directly change internal parameters of the interface. The parameters the transmitter control interface is allowed to control are the gain of the pre-processor and the parameters of the DSP. As mentioned above, these parameters can be related to equalization, compression, encryption or error correction for example. Other parameters may also be controlled by the transmitter control interface.

The parameters the receiver control interface is allowed to control may be parameters used by any of the individual audio channel DSPs, the mixing DSP and/or the volume module or amplifier 305. Other parameters could also be controlled by this receiver control interface. In some embodiments, instead of having an analog volume module, the volume is controlled in the analog output module, controllable via the receiver control interface.

The parameters may be controlled by different users. Some or all of the parameters of both types of control interfaces may be controlled directly by the musician who uses the specific transmitter or receiver. Usually, a musician would at least be authorized to control the volume of all the instruments he or she receives in his or her headset.

According to one embodiment, the musician is also allowed to control the volume, level or gain of his or her own instrument at the input of the transmitter. The musician may also control the volume, level or gain of the other musicians' instruments at the inputs of their own transmitters so that he or she can play the role of a sound technician.

It is also possible to give specific rights to a particular user such as for example a sound technician, and other rights to other users, for example participating musicians. A combination of all the possible embodiments described above is also possible.

The modification of the parameters can be done directly on the transmitter or on the receiver, provided this device has an adequate physical interface. The modifications can also be made remotely, through a dedicated remote control for example or through a multi-purpose device hosting a specific application. Such a multi-purpose device can be a smartphone, a tablet, a computer, or any other similar device.

According to different embodiments the transmitter and/or receiver may be controlled by receiving control instructions via a control interface having buttons, knobs or sliders or other such controllers accessible by the musician for altering different parameters to affect the sounds of the different channels of audio signals. The controllers may be hardware elements or may be software-generated controllers displayed on a touch-sensitive screen. Alternatively, a separate portable controller device may be programmed to send the control instructions wirelessly to the mixer for adjusting the different parameters. Suitable wireless communications protocols for sending control instructions are short-range wireless protocols such as Bluetooth or NFC for example. Suitable control devices include smart phones or tablet computers for example.

Alternatively, control instructions for modifying the parameters may be provided to the mixer within the encoded radio signal broadcast. For example, in a digital radio protocol where headers and content packets are used, the control instructions may be incorporated into the header. In this manner a technician may generate control instructions using a terminal with a transmitter to include the instructions in the broadcast radio signal, thus causing any or all of the musicians' mixers to process their received audio signals in a particular way. Each of the musicians could also affect the mix of any or all of the other musicians' monitors in a similar way using information in the header.

Instructions may also be sent in specific signals transmitted either by radio, by other communication protocols such as for example LPWAN, LoRaWAN, SigFox, ZigBee, Bluetooth, Bluetooth Low Energy, 6lowpan, ANT, RFID and NFC or by a combination of those transmission modes.

These instructions usually comprise an identifier of the device for which the signal is intended, as well as an identifier of the parameter to be changed and an indication of the change to be made to this parameter. This indication can be an absolute value, i.e. a value at which the parameter must be set, or a relative value, i.e. a difference with the current value of this parameter.

The signals corresponding to instructions can be scrambled, encrypted, compressed or otherwise processed before being sent or broadcast. An opposed processing is performed on the reception side to enable the use of the instructions.

Embodiments disclosed herein do not require a central mixing desk to provide pre-mixed or mixed audio signals from the sources back to the musicians. Instead, each musician's monitor system is configured to receive every musician's audio signals directly from their own personal monitoring systems and the mixing is performed by the musicians themselves using their monitoring systems. The mixing in one system is done using the signals from the other systems, decoded from the radio broadcast.

The system may further comprise a memory, preferably in one or more of the controllers, to allow mix configurations of the system to be stored and recalled.

Receivers of the system may be described as multi-stream receivers since they capture all of the audio streams or tracks from the broadcast signal comprising audio signals from all of the participating transmitters in the system. The receiver may further comprise a processor for mixing the different audio streams according to commands and parameters provided by the user via the controller and an output interface for providing the thus mixed audio streams to the user, preferably via a wireless in-ear monitor or a monitor placed on the stage. In some embodiments the monitor may be hardwired to the output interface. Each receiver in the system may provide separate individually tailored mixes to their monitors. As well as monitoring, the system may record one or more different mixes in a memory of the system. Such a memory may be placed in a receiver or somewhere in the communications network. A recording memory may even be placed in a transmitter, where either raw or processed audio tracks may be recorded, or a full mix may be recorded.

Examples of commands which may be provided by a controller include a level setting for the complete mix, crossfader instructions in which different levels may be given for the musician's own instrument and the sound of the rest of the band, mute all, mute the musician's own instrument, solo mode where only the musician's own instrument is heard or recorded, listen to or record only the musician's own instrument or the musician's previously programmed mix or all tracks in "raw" unmixed mode.

As well as commands or instructions being provided via the controller, according to an embodiment, a receiver may have a hardwired command interface on it. This would be useful for example to quickly provide a mute instruction where the receiver provides no sound on a quick press of a button on the receiver, for example. According to another embodiment, a transmitter may also have physical buttons for providing fast commands such as mute or to increase or decrease the level of a signal at its input or output for example.

According to embodiments, digital signal processing functions in the receivers and in the transmitters provide for less than 2 ms of latency between a sound source and the output at the monitor. Such latency is considered, in the domain, to be an indiscernible lag or at least a lag which would not inhibit a musician from playing comfortably.

According to an embodiment, digital compression and decompression techniques may be used to minimize the amount of data that needs to be transmitted across the communication channel from transmitters to receivers, thereby also contributing to the low latency of the system.

Receivers, transmitters and controllers used within embodiments disclosed herein may be mobile wireless devices and thus are generally battery-operated.

The invention claimed is:

1. A distributed audio processing system for processing audio signals from a plurality of sources and for providing one or more personalized mixes of the audio signals to one or more users, the system comprising: for each source a corresponding transmitter; and for each user a corresponding receiver;
    each transmitter comprising:
        an audio input interface configured to receive the audio signal from its corresponding source, the audio signal having a level;
        a pre-amplifier configured to alter the level of the received audio signal by an amount determined by an input gain control parameter, thus applying a positive or negative gain to the received audio signal;
        a digital signal processing unit configured to process the pre-amplified audio signal according to a transmission processing algorithm using one or more DSP control parameters;
        a network transmission interface to provide the thus processed audio signal to the plurality of receivers as a multi-track audio signal via a communications network according to a predetermined communications protocol; and
        a control interface configured to receive at least the input gain control parameter and/or the DSP control parameters via a control link; and
    each receiver comprising:
        a network reception interface configured to receive the multi-track audio signal from the communications network and to extract one or more audio tracks from the multi-track audio signal;
        a plurality of audio channel digital signal processors each for providing digital processing functions on the extracted audio tracks according to a reception processing algorithm using one or more channel DSP control parameters;
        a mixing digital signal processor to process a combination of the digitally processed audio tracks according to a mixing processing algorithm using one or more mixing control parameters;
        an amplifier configured to alter a level of the combined digitally processed audio tracks by an amount determined by an output gain control parameter;
        an output interface to provide the level-altered digitally processed audio tracks to the user; and
        a control interface configured to receive at least the channel DSP control parameters, the mixing control parameters and/or the output gain control parameter via the control link;
    the system further comprising, for each user, a controller configured to provide the control parameters used at least by the corresponding user's receiver to said receiver via the control link;
    wherein:
        said controller is further configured to provide the control parameters used by any of the transmitters or by any of the remaining receivers to said transmitters or remaining receivers via the control link.

2. The distributed audio processing system according to claim 1, wherein at least one of the receivers is configured to intercept one or more control parameters sent to at least one of the transmitters and to derive therefrom at least one further channel DSP control parameter, mixing control parameter or output gain control parameter and use said derived parameter in said receiver to compensate for an effect caused by said one or more control parameter when used in said transmitter.

3. The distributed audio processing system according to claim 2, the system being a wireless system wherein the transmitters are wireless transmitters, the receivers are wireless receivers, the communications network is a wireless communications network and the network reception interface is configured to receive the multi-track audio signal from the communications network.

4. The distributed audio processing system according to claim 3, wherein the wireless communications network is a radio broadcast network.

5. The distributed audio processing system according to claim 3, wherein the transmitter is comprised within a musical instrument.

6. The distributed audio processing system according to claim 3, wherein the receiver is a portable mobile device worn by the user.

7. The distributed audio processing system according to claim 2, the system being a wireless system wherein the control link is a wireless control link and the controllers are configured to provide the control instructions and/or parameters via the wireless control link.

8. The distributed audio processing system according to claim 1, wherein at least one transmitter is configured to receive its audio signal from an instrument which provides an analog audio signal, said transmitter further comprising:
    an analog to digital converter configured to convert the pre-amplified audio signal to a digital domain, suitable for processing by the digital signal processor.

9. The distributed audio processing system according to claim 1, wherein the output interface of at least one receiver is configured to provide an analog audio output, said receiver further comprising a digital to analog converter to provide an analog input for the output interface.

10. A method for processing a plurality of audio signals from a plurality of sources and for providing one or more personalized mixes of the plurality of audio signals to one or more users, the method using the distributed audio processing system according to claim 1, the method comprising:
    receiving and processing at least one of the audio signals in the transmitter, said processing being controlled by at least one control parameter received by the transmitter via a control link;
    transmitting, by each of the transmitters, via a communications channel, the processed audio signal as a multi-track audio signal to the receivers;
    receiving and extracting, by at least one of the receivers, a plurality of audio signals from the multi-track audio signal;
    at least mixing, by the receiver, the plurality of audio signals to provide a combined audio output to the user, said mix being controlled by at least one mixing control parameter received via the control link.

11. The method according to claim 10, the method further comprising:
    receiving, by the receiver, the control parameter intended for the transmitter;

adjusting said mixing control parameter in the receiver to compensate for an effect that the control parameter intended for the transmitter would have on the processed audio signal transmitted by the transmitter.

12. The method according to claim 1, wherein the source is connected to the respective transmitter and the respective receiver.

13. The method according to claim 1, wherein a plurality of sources are connected to the respective transmitter, and wherein the respective receiver is connected to a plurality of users.

14. The method according to claim 1, the method further comprising synchronizing the transmitters and receivers.

* * * * *